United States Patent
Nishida

Patent Number: 5,742,901
Date of Patent: Apr. 21, 1998

[54] BALANCED MODULATOR

[75] Inventor: Masakazu Nishida, Tokyo, Japan

[73] Assignee: NEC Corporation, Tokyo, Japan

[21] Appl. No.: 733,111

[22] Filed: Oct. 16, 1996

[30] Foreign Application Priority Data

Oct. 17, 1995 [JP] Japan ................... 7-268630

[51] Int. Cl.$^6$ ................... H04B 1/26
[52] U.S. Cl. ................... 455/326; 455/330
[58] Field of Search ................... 455/326, 330, 455/327, 325, 323; 332/129, 130; 329/322

[56] References Cited

U.S. PATENT DOCUMENTS

| | | | |
|---|---|---|---|
| 5,142,697 | 8/1992 | Podvin | 455/326 |
| 5,179,732 | 1/1993 | Omoto | 455/326 |
| 5,369,795 | 11/1994 | Yanagimoto | 455/327 |
| 5,640,699 | 6/1997 | Ralph | 455/326 |

FOREIGN PATENT DOCUMENTS

| | | | |
|---|---|---|---|
| 0198207 | 8/1990 | Japan | 455/326 |
| 5-48342 | 2/1993 | Japan . | |

Primary Examiner—Reinhard J. Eisenzopf
Assistant Examiner—Edan Orgad
Attorney, Agent, or Firm—Sughrue, Mion, Zinn, Macpeak & Seas, PLLC

[57] ABSTRACT

In a balanced modulator, a local oscillator frequency signal is transmitted through a serial connection of the primary side conductive patterns (1p and 2p) of a first coupler (1) and a second coupler (2), wherein the two couplers (1 and 2) are connected in an opposing direction. A first output terminal of the secondary side conductive pattern (1s) of the first coupler (1) is grounded through a first effective grounding pattern (4), and a first output terminal of the secondary side conductive pattern (2s) of the second coupler (2) is grounded through a second effective grounding pattern (5). The output voltage at a second output terminal of the secondary side conductive pattern (1s) of the first coupler (1) is impressed to a terminal of a first diode (9). The output voltage at a second output terminal of the secondary side conductive pattern (2s) of the second coupler (2) is impressed to a terminal of a second diode (10). A compensation pattern (3) is inserted between the serial connection of the primary side conductive patterns (1p and 2p) for compensating an unbalance caused by the two effective grounding patterns (4 and 5).

2 Claims, 5 Drawing Sheets

```
 1 : first coupler
 2 : second coupler
 3 : compensation pattern
 4 : first grounding pattern
 5 : second grounding pattern
 6 : local oscillator
 7 : first output pattern
 8 : second output pattern
 9 : first diode
10 : second diode
11 : first input line
12 : second input line
13, 14 : capacitance patterns
15 : LF-terminal
```

1 : first coupler
2 : second coupler
3 : compensation pattern
4 : first grounding pattern
5 : second grounding pattern
6 : local oscillator
7 : first output pattern
8 : second output pattern
9 : first diode
10 : second diode
11 : first input line
12 : second input line
13, 14 : capacitance patterns
15 : LF-terminal

1

BALANCED MODULATOR

BACKGROUND OF THE INVENTION

The present invention relates to a balanced modulator for a microwave frequency band, and more particularly to that of a high isolation characteristic wherein imbalance caused by grounding impedance is well compensated.

FIG. 6 shows a pattern diagram illustrating a balanced modulator of a prior art in a microwave frequency band described in a Japanese patent application by Yanamoto laid open as a Provisional Publication No. 48342/'93. Therein, a first conductive pattern 21a, a second conductive pattern 21b, and a third conductive pattern 22 are formed on a surface of a printed circuit board. The first conductive pattern 21a and the second conductive pattern 21b are arranged on a line inserting a non-conductive space between them. The third conductive pattern 22 is arranged perpendicular to the line of the first and the second conductive patterns 21a and 21b and is connected to the first and the second conductive patterns 21a and 21b at their inner ends facing the non-conductive space.

Outer ends of both the first and the second conductive patterns 21a and 21b are grounded. A concentric feeder line 25 is provided with its outer conductor bonded along the first conductive pattern 21a. A local frequency signal LF generated by a local frequency oscillator 26 is supplied to inner conductor of the concentric feeder line 25 from its end at the outer end of the first conductive pattern 21a. The other end of the inner conductor of the concentric feeder line 25 is connected to inner end of the second conductive pattern 21b. The third conductive pattern 22 has branches 23a and 23b, each connected to the inner ends of the first conductive pattern 21a and the second conductive pattern 21b respectively, the second conductive pattern 21b forming a dummy pattern against the first conductive pattern 21a. A serial connection of two diodes D1 and D2 are provided between the inner ends of the first and the second conductive patterns 21a and 21b.

FIG. 7 is a circuit diagram illustrating an equivalent circuit of the balanced modulator of FIG. 6. The inductance of the concentric feeder line 25 along the first conductive pattern 21a is represented by La. The inductance formed by the branches 23a, 23b is represented by Lb. The inductance Lb works as a common mode choke.

Being input at junction point 24 of the two diodes D1 and D2, a radio frequency signal RF is mixed with the local frequency signal LF by the two diodes D1 and D2 switched by the local frequency signal LF supplied through a coupler composed of the concentric feeder line 25 and the first conductive pattern 21a, and an intermediate frequency signal IF having a frequency equal to frequency difference between the radio frequency signal RF and the local frequency signal LF is output through the third conductive pattern 22.

As a numerical example, when a radio frequency signal RF from 0 to 1.5 GHz is to be modulated into an intermediate frequency signal IF of 2 GHz, a local frequency signal LF of 2 to 3.5 GHz is prepared according to the frequency of the radio frequency signal RF. And, similarly, an intermediate frequency signal IF of 2 GHz supplied to the junction point 24 can be modulated into a radio frequency signal RF of 0 to 1.5 GHz by providing a local frequency signal LF of 2 to 3.5 GHz.

For coupling the output of the local oscillator 26, length of the first conductive pattern 21a is the better to be the longer, but undesired resonance may occur when it is too long. So, the length of the first conductive pattern 21a is generally designed as ¼ of wave length λ in the conductive pattern of a specific frequency, namely maximum frequency, 3.5 GHz in the case, to be treated therein.

In balanced modulators as the prior art above described, circuit configuration is to be well balanced as well as necessarily filtered for isolating undesired signals, the local frequency signal LF, the radio frequency signal RF or their derivatives other than the intermediate signal IF to be output, and further, characteristic impedance of signal transmission lines must be also matched with each other to avoid unnecessary signal reflections at their connecting points.

For the purpose, the conductive pattern 21a connecting output of the local frequency oscillator 26 to the diode D1, the conductive pattern 21b for grounding the diode D2, and the conductive pattern 22 from the two diodes D1 and D2 to the output terminal 27 of FIG. 6 must be matched with each other to have the same characteristic impedance with that, 50 Ω in general, of the transmission lines for the radio frequency signal RF and the intermediate frequency signal IF.

However, for grounding each outer end of the first and the second conductive patterns 21a and 21b, it is connected, for example, to a point in a conductive pattern (not shown in FIG. 6) of grounding potential provided on the back of the printed circuit board with a through-hole. It means a kind of conductive pattern having different impedance is inevitably inserted between each end to be grounded and the effective grounding point. Because of the imbalance of grounding impedance caused by the inequality of grounding patterns, the isolation performance is easy to be degraded in the balanced modulators of the prior art, resulting in leaking out of the radio frequency signal RF and the local frequency signal LF into the intermediate signal IF to be extracted.

This is a problem.

SUMMARY OF THE INVENTION

Therefore, an object of the present invention is to provide a balanced modulator of a simple configuration wherein the isolation degradation because of the imbalance of grounding impedance is well compensated.

In order to achieve the object, a balanced modulator of the present invention for outputting a modulated signal by multiplying a first input signal and a second input signal having a frequency different from a frequency of the first input signal, comprises:

a first coupler having a first conductive pattern and a second conductive pattern electromagnetically coupled to said first conductive pattern, an outer end of said first conductive pattern of said first coupler being supplied with the first input signal;

a second coupler equivalent to said first coupler having a first conductive pattern and a second conductive pattern electromagnetically coupled to said first conductive pattern;

a first effective grounding pattern for grounding an outer end of said second conductive pattern of said first coupler;

a second effective grounding pattern for grounding an outer end of said second conductive pattern of said second coupler;

a first diode connected between an inner end of said second conductive pattern of said first coupler and one of a pair of input lines, between which the second input signal is supplied;

a second diode connected equivalently to said first diode between an inner end of said second conductive pattern of said second coupler and the other of said pair of input lines;

a first output pattern connected between said inner end of said first conductive pattern of said first coupler and an output terminal for outputting said modulated signal;

a second output pattern connected between said inner end of said second conductive pattern of said second coupler and said output terminal; and a compensation pattern connected between an inner end of said first conductive pattern of said first coupler and an inner end of said first conductive pattern of said second coupler for compensating electrical imbalance caused by impedance difference between said first effective grounding pattern and said second effective grounding pattern.

Therefore, by setting the impedance value of said compensation pattern equal to sum of impedance values of said first and said second effective grounding patterns, a balanced modulator of a simple configuration can be provided in the invention, wherein the isolation degradation because of the imbalance of grounding impedance is well compensated.

DESCRIPTION OF THE DRAWINGS

The foregoing, further objects, features, and advantages of this invention will become apparent from a consideration of the following description, the appended claims, and the accompanying drawings following in which the same numerals indicate the same or the corresponding parts.

DETAILED DESCRIPTION OF THE PREFERRED EMBODIMENTS

Figure 1:
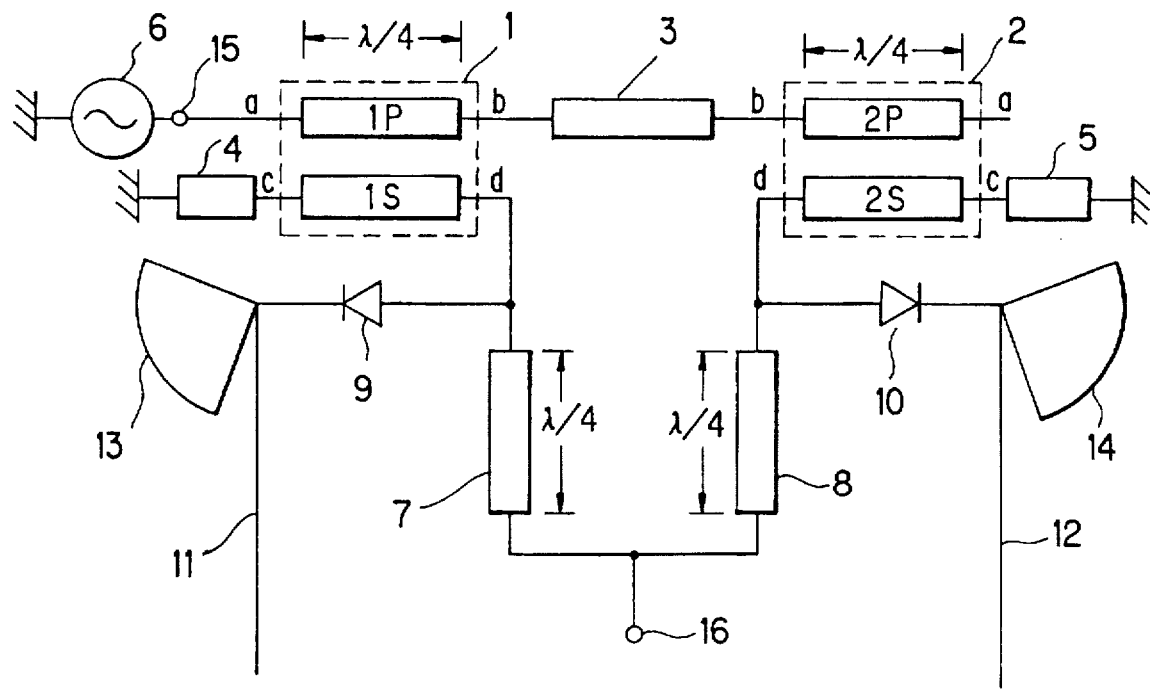
FIG. 1 is a circuit diagram illustrating an embodiment of the present invention.

Now, referring to the drawings, an embodiment of the present invention will be described.

Figure 2:
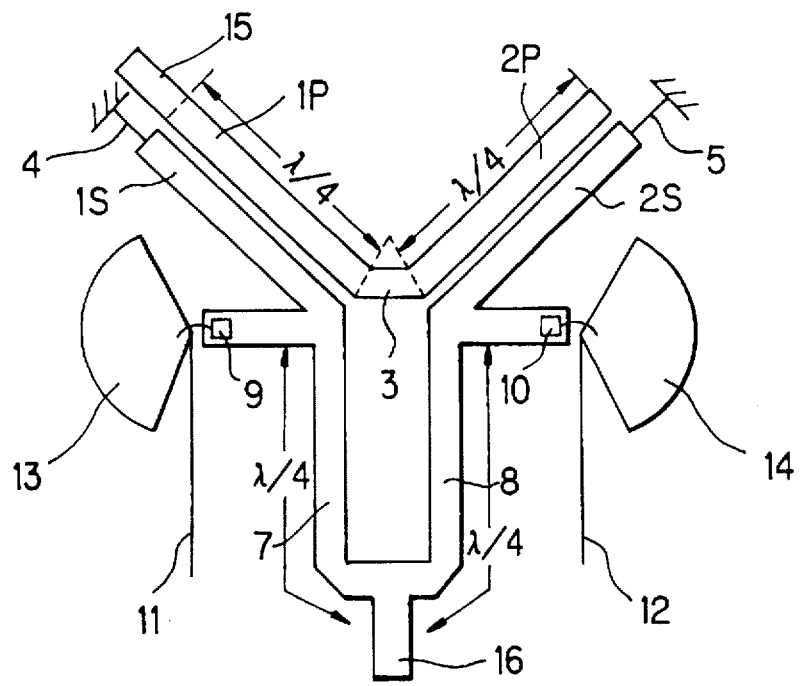
FIG. 2 is a pattern diagram of the embodiment of FIG. 1.

FIG. 1 is a circuit diagram illustrating the embodiment, whereof a pattern configuration is shown in FIG. 2.

Each of a first coupler 1 and a second coupler 2 provided therein comprises a first conductive pattern 1p or 2p and a second conductive pattern 1s or 2s arranged closely in parallel to the first conductive pattern 1p or 2p, both having a length of $\lambda/4$ ($\lambda$ being wave length of the specific frequency) and working as a transformer for outputting an alternating signal between outer end c and inner end d, functioning as secondary terminals, of the second conductive pattern 1s or 2s corresponding to an input signal supplied between outer end a and inner end b, functioning as primary terminals, of the first conductive pattern 1p or 2p with a coupling coefficient, the first conductive pattern 1p or 2p and the second conductive pattern 1s or 2s coupled electromagnetically.

Output of a local oscillator 6 is supplied to a LF-terminal 15 connected to the inner end a of the first conductive pattern 1p of the first coupler 1. The inner end b of the first conductive pattern 1p of the first coupler 1 is connected to the inner end b of the first conductive pattern of the second coupler 2 through a compensation pattern 3, the outer end a of the first conductive pattern 2p of the second coupler 2 being left open.

The outer end c of the second conductive pattern 1s or 2s of each of the first and the second couplers 1 and 2 is grounded through each of a first and a second effective grounding patterns 4 and 5.

The inner end d of the second conductive pattern 1s of the first coupler 1 is connected with an anode of a first diode 9 together with an end of a first output pattern 7 having a length of $\lambda/4$, while the inner end d of the second conductive pattern 2s of the second coupler 2 is connected with an anode of a second diode 10 together with an end of a second output pattern 8 having the same configuration to the first output pattern 7. The other ends of the first and the second output patterns 7 and 8 are both connected to an output terminal 16. And, each cathode of the first and the second diodes 9 and 10 is connected to each of input lines 11 and 12 together with each of capacitance patterns 13 and 14, respectively.

With a configuration as above described, the balanced modulator of the embodiment composed of a first part including the first coupler 1, the first diode 9 and the first output pattern 7 and a second part including the second coupler 2, the second diode 10 and the second output pattern 8 performs as follows, when the first part and the second part were well balanced.

When there is no input signal other than local frequency signal LF input to the LF-terminal 15 from the local oscillator 9, at anodes of the first and the second diodes 9 and 10 are supplied signals having the same amplitude of opposite phase, which generate nothing to the output terminal 16, being cancelled by each other through the first and the second output patterns 7 and 8.

When a signal, an intermediate frequency signal IF for example, is impressed between the input lines 11 and 12 together with the local frequency signal LF input from the LF-terminal 15, signals corresponding to (LF+IF) and (LF−IF) are rectified by the first and the second diodes 9 and 10 respectively, producing frequency components corresponding to $(LF+IF)^2$ and $(LF-IF)^2$ respectively. So, a frequency component corresponding to LF×IF=RF is output through the output terminal 16, frequency components corresponding to LF, IF, $LF^2$, $IF^2$, etc., being cancelled. Thus, an intermediate signal IF is modulated by a local frequency signal LF into a radio frequency signal RF, or a radio frequency signal RF impressed between the input lines 11 and 12 is similarly modulated into an intermediate frequency signal IF.

However, it is inevitable as beforehand described that the effective grounding patterns 4 and 5 should accompany the first and the second coupler 1 and 2 for grounding the inner ends c of the second conductive patterns 1s and 2s thereof with through-holes, for example, and it is difficult to equilibrate impedance of the effective grounding patterns 4 and 5, resulting in a break of electrical balance therein.

Figure 4:
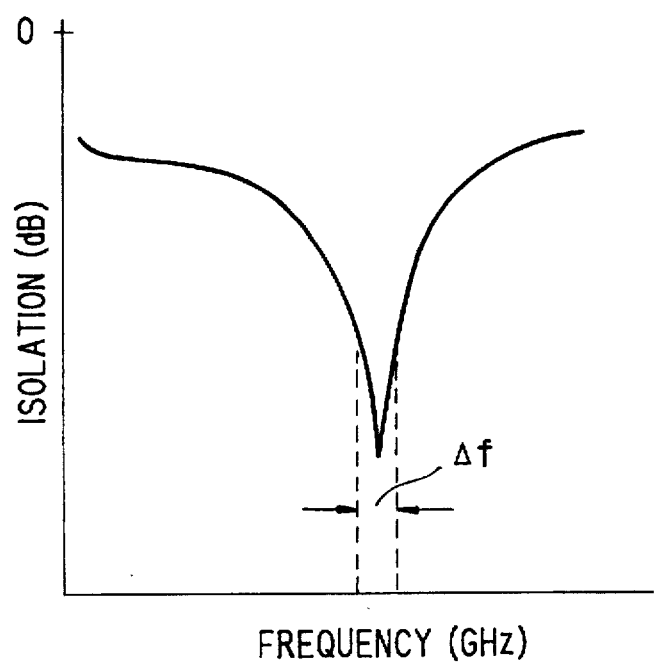
FIG. 4 is a graphic chart illustrating an example, narrow band, of isolation characteristic without compensation pattern.
Figure 5:
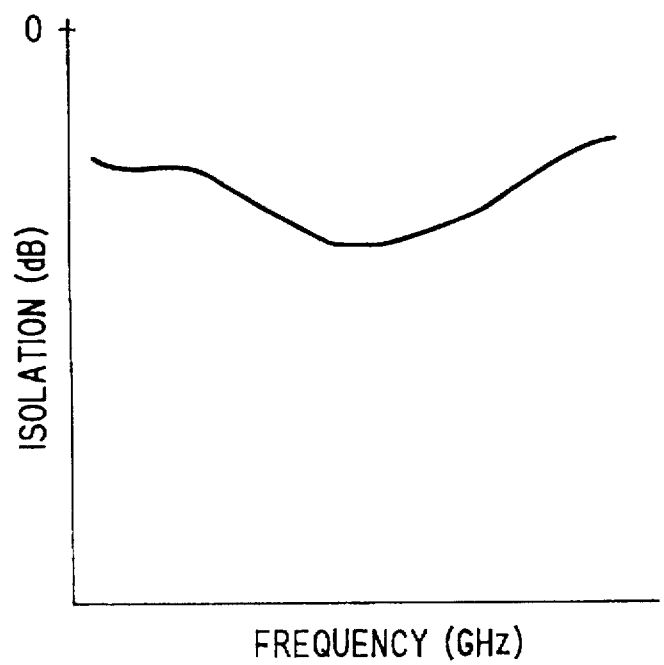
FIG. 5 is a graphic chart illustrating another example, degraded for a wide band, of isolation characteristic without compensation pattern.
Figure 6:
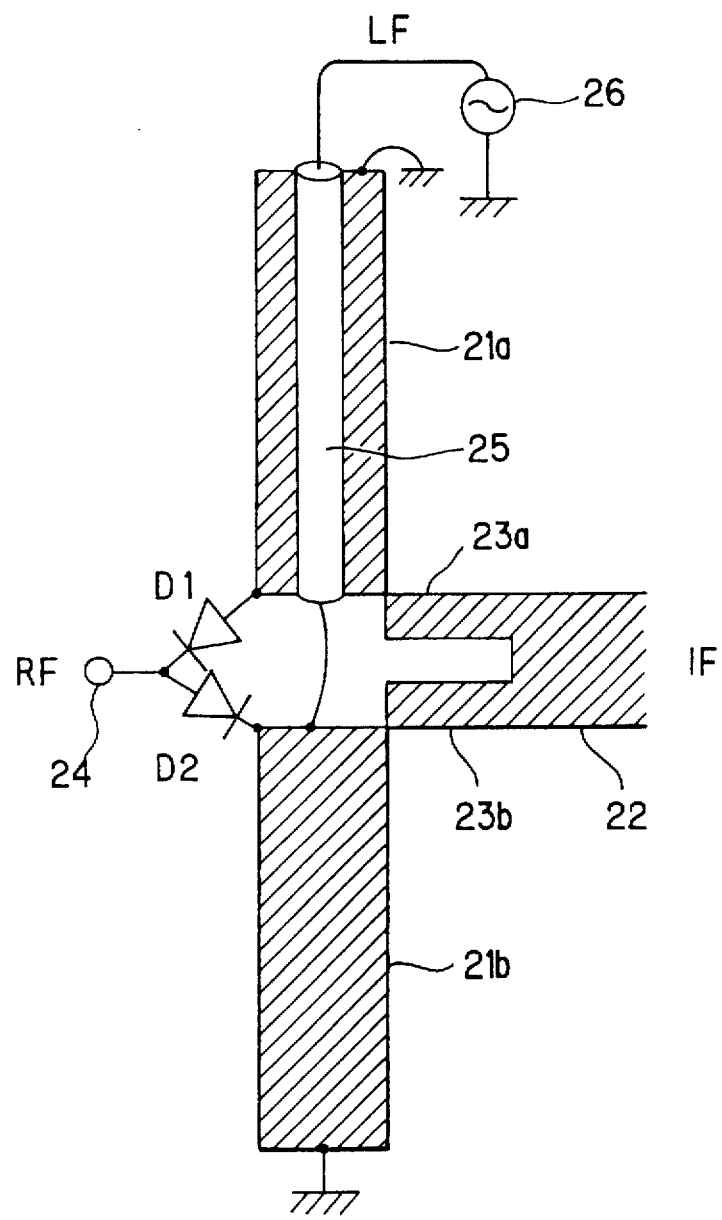
FIG. 6 is a pattern diagram illustrating a balanced modulator of a prior art.
Figure 7:
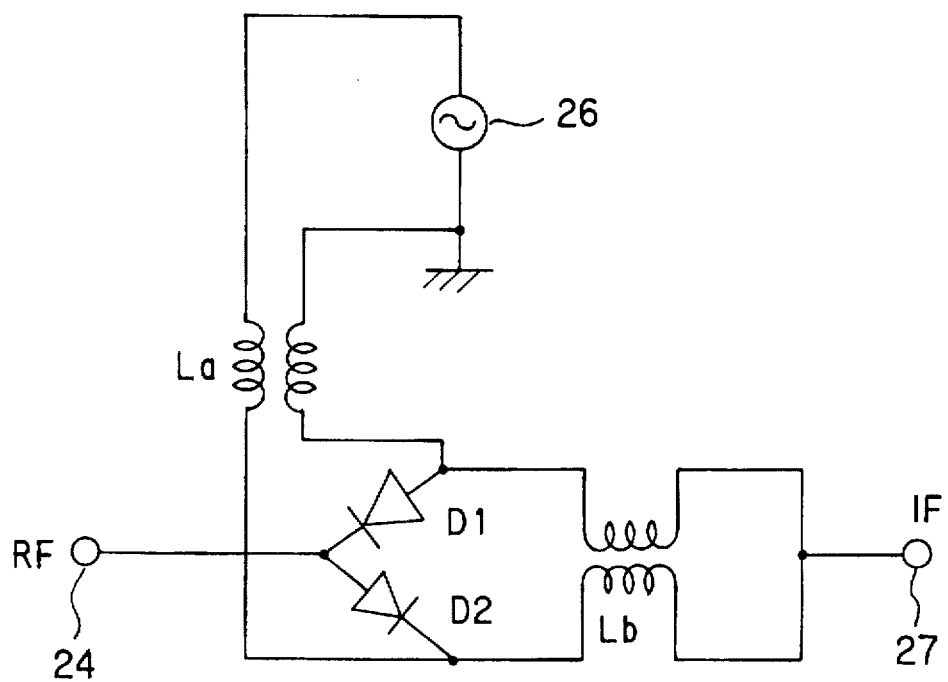
FIG. 7 shows an equivalent circuit of FIG. 6.

When the first and the second parts of the balanced modulator of FIG. 1 are not balanced, isolation characteristic is degraded becoming very narrow band width as illustrated in FIG. 4 or becoming poor for s a wide band width as illustrated in FIG. 5, and so, the local frequency signal LF or the input signal (the radio frequency signal RF or the intermediate frequency signal IF according to the case) leaks out of the output terminal 16.

For compensating the electrical imbalance because of the impedance difference between the first and the second effective grounding patterns 4 and 5, the compensation pattern 3 is provided in the embodiment between the inner ends b of the first conductive patterns 1p and 2p of the first and the second couplers 1 and 2. In the embodiment, length of the compensation pattern 3 is designed to have an impedance value equal to sum of impedance values of the effective grounding patterns 4 and 5.

Figure 3:
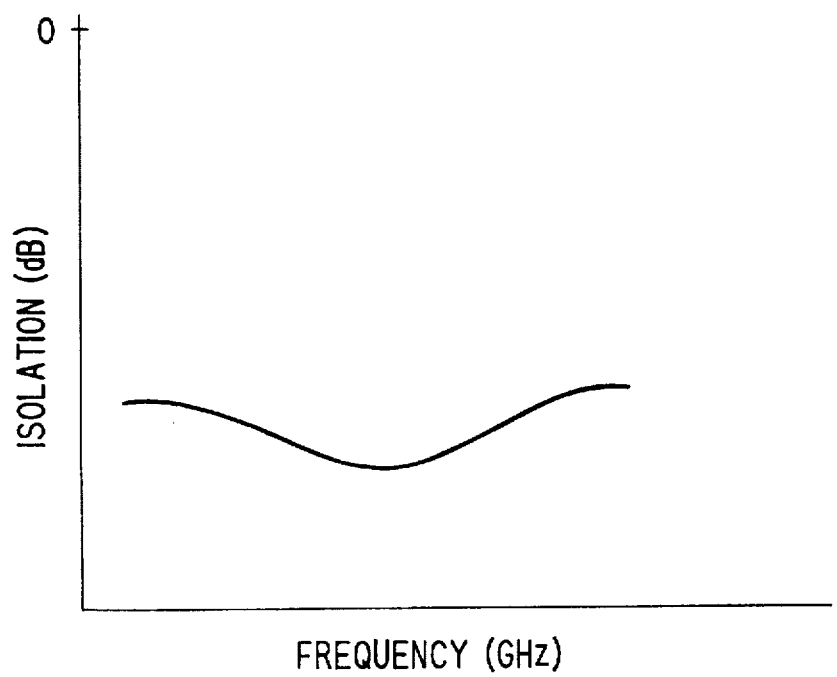
FIG. 3 is a graphic chart illustrating isolation characteristic of a balanced modulator of the invention.

FIG. 3 is a graphic chart having the same scale with FIGS. 4 and 5 illustrating isolation characteristic of the embodiment provided with the compensation pattern 3 thus prepared, wherein the isolation characteristic is improved for a wide band.

Thus, the degradation of isolation characteristic is prevented with a simple configuration in the present invention, by compensating, with the compensation pattern 3 provided between them, the electrical imbalance because of the difference of grounding impedance between the first and the second coupler 1 and 2.

What is claimed is:

1. A balanced modulator for outputting a modulated signal by multiplying a first input signal and a second input signal, the second input signal having a frequency different from a frequency of the first input signal, comprising:

a first coupler having a first conductive pattern and a second conductive pattern electromagnetically coupled to said first conductive pattern, an outer end of said first conductive pattern of said first coupler being supplied with the first input signal;

a second coupler equivalent to said first coupler having a first conductive pattern and a second conductive pattern electromagnetically coupled to said first conductive pattern;

a first effective grounding pattern for grounding an outer end of said second conductive pattern of said first coupler;

a second effective grounding pattern for grounding an outer end of said second conductive pattern of said second coupler;

a first diode connected between an inner end of said second conductive pattern of said first coupler and one of a pair of input lines, between which the second input signal is supplied;

a second diode connected equivalently to said first diode between an inner end of said second conductive pattern of said second coupler and the other of said pair of input lines;

a first output pattern connected between said inner end of said second conductive pattern of said first coupler and an output terminal for outputting said modulated signal;

a second output pattern connected between said inner end of said second conductive pattern of said second coupler and said output terminal; and a compensation pattern connected between an inner end of said first conductive pattern of said first coupler and an inner end of said first conductive pattern of said second coupler for compensating electrical imbalance caused by impedance difference between said first effective grounding pattern and said second effective grounding pattern.

2. A balanced modulator recited in claim 1, wherein an impedance value of said compensation pattern is set to be equal to a sum of impedance values of said first and said second effective grounding patterns.

* * * * *